(12) United States Patent
Kawano

(10) Patent No.: US 6,611,462 B2
(45) Date of Patent: Aug. 26, 2003

(54) SEMICONDUCTOR INTEGRATED CIRCUIT

(75) Inventor: Takashi Kawano, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 162 days.

(21) Appl. No.: 09/764,496

(22) Filed: Jan. 17, 2001

(65) Prior Publication Data

US 2001/0008490 A1 Jul. 19, 2001

(30) Foreign Application Priority Data

Jan. 19, 2000 (JP) ........................................ 2000-009691

(51) Int. Cl.⁷ ............................................... G11C 16/06
(52) U.S. Cl. ............................ 365/185.23; 365/185.18; 365/189.05
(58) Field of Search ....................... 365/185.23, 185.18, 365/189.05

(56) References Cited

U.S. PATENT DOCUMENTS 5,973,989 A * 10/1999 Pawlowski .................. 365/233
6,240,046 B1 * 5/2001 Proebsting ................... 365/233

FOREIGN PATENT DOCUMENTS

| JP | 2-140853 | 5/1990 |
| JP | 02-183498 | 7/1990 |

* cited by examiner

Primary Examiner—David Nelms
Assistant Examiner—Connie C. Yoha
(74) Attorney, Agent, or Firm—Katten Muchin Zavis Rosenman

(57) ABSTRACT

A semiconductor integrated circuit having a non-volatile memory has a data fetch control portion for generating a one-shot pulse having a protrusive pulse shaped waveform for fetching write data PD separately into each latch of upper order side and each latch of lower order side, based on a logical value of the least significant address of a write address PA at one write cycle of a write command in a write mode, "x 8 mode". When a write command is input to a command system circuit, a write data fetch command is repeated twice, and write data PD is fetched for each 8 bits to a data latch portion and the data latch portion writes the input write data PD of 16 bits to the non-volatile memory in batch.

6 Claims, 8 Drawing Sheets

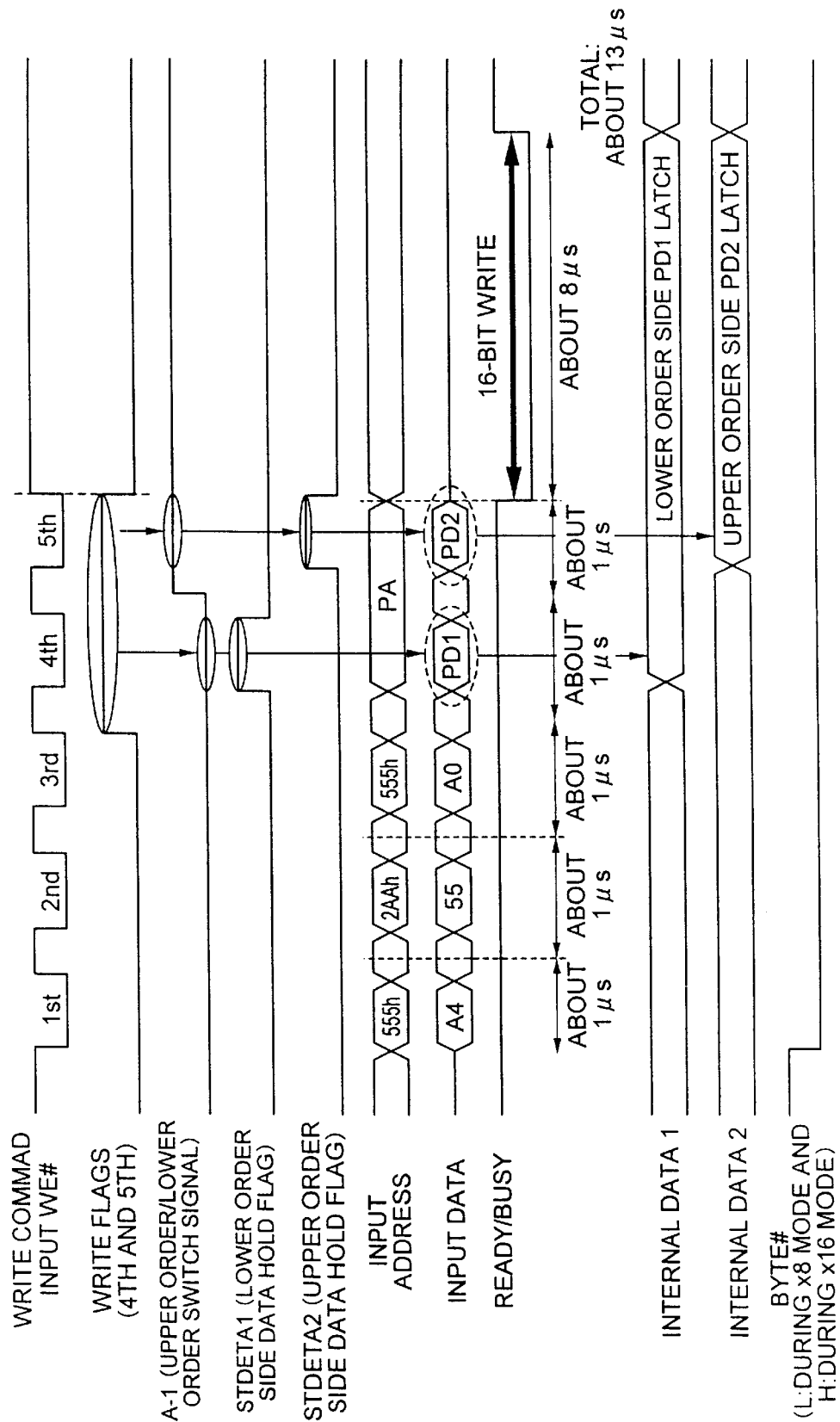

SEMICONDUCTOR INTEGRATED CIRCUIT

BACKGROUND OF THE INVENTION

1. Field of the Invention

The present invention relates to a semiconductor integrated circuit having a non-volatile memory. In particular, the present invention relates to a semiconductor integrated circuit capable of reducing a write cycle of a write command to one time when 16 bits data is written in a write mode in units of 8 bits.

2. Description of the Related Art

FIG. 1 is a block diagram showing a configuration of a conventional semiconductor integrated circuit 1 having a non-volatile memory. As shown in FIG. 1, the conventional semiconductor integrated circuit 1 comprises an input buffer 2 for controlling data input and/or output, having 16 external data pins DQ1 to DQ15, and a switch portion 3 is connected to the input buffer 2. To the switch portion 3, the least significant address [A-1] of a write address PA (program address) is input via an external address pin (not shown). In addition, a data latch portion 4 for saving input data for a short time is provided so as to be connected to the switch portion 3; a write circuits 5 are provided so as to be connected to the data latch portion 4; and there are provided memory cells 6 (refer to FIG. 5) of an non-volatile memory so as to be connected to the write circuits 5. In addition, 16 latches L0 to L15 are provided at the data latch portion 4. Each latch holds 1-bit data until a new signal has been input.

To the input buffer 2, data is externally input via the external data pins DQ1 to DQ15, and the data is input from the input buffer 2 to the switch portion 3. The switch portion 3 distributes the input data into latches selected from latches L0 to L15 of the data latch portion 4 based on a logical value of the least significant address [A-1] of the write address PA.

In addition, a data fetch control portion 7 is provided so as to be connected to the data latch portion 4, and a command system circuit 8 is provided so as to be connected to the data fetch control portion 7. A write enable signal WE# for controlling write operation of the semiconductor integrated circuit 1 is input to the data fetch control portion 7. Further, a reset circuit 9 for resetting output data of each latch of the data latch portion 4 is provided so as to be connected to the data latch portion 4. To the reset circuit 9, the least significant address [A-1] of the write address PA and a write mode switching signal BYTE# for switching a write mode of the semiconductor integrated circuit 1 are input.

The conventional semiconductor integrated circuit 1 enables operation in two modes, i.e., a "x 8 mode" for writing data in units of 8 bits and a "x 16 mode" for writing data in units of 16 bits. In addition, the circuit performs switching by the write mode switching signal BYTE#. For example, in a case where a logical value of the write mode switching signal BYTE# is "L", the "x 8 mode" is selected, and in a case where a logical value of the write mode switching signal BYTE# is "H", the "x 16 mode" is selected.

Now, operation of the semiconductor integrated circuit 1 will be described. FIG. 2 is a timing chart showing a 16 bits data write operation in the "x 8 mode" in the conventional semiconductor integrated circuit 1. As shown in FIGS. 1 and 2, a logical value of the write mode switching signal BYTE# to be input to the reset circuit 9 is "L", and the "x 8 mode" is selected as a write mode. Next, the write data PD (program data) is input to the input buffer 2 via the external data pins DQ0 to DQ7. At this time, in a case where the logical value of the least significant address [A-1] of the write address PA to be input to the switch portion 3 is "L", the write data PD is distributed to latches L0 to L7 that configure a lower order side of the data latch portion 4 by the switch portion 3. The input data is then latched in the latches L0 to L7. In addition, when the least significant address [A-1] of the write address PA is "H", the write data PD is distributed to latches L8 to L15 that configure an upper order side of the data latch portion 4 by the switch portion 3. The input data is then latched in the latches L8 to L15.

When the logical value of the least significant address [A-1] is "L", an upper order side reset signal RST1 is outputted from the reset circuit 9 to reset terminals R of the latches L8 to L15 that configure the upper order side of the data latch portion 4. The output values of these latches for unused 8 bits are set to "FFh" by resetting the latches L8 to L15. On the other hand, when the logical value of the least significant address [A-1] is "H", a lower order side reset signal RST2 is outputted to the reset terminals R of the latches L0 to L7 that configure the lower order side of the data latch portion 4. The output values of these latches for unused 8 bits are set to "FFh" by resetting the latches L0 to L7. That is, "H" of "FFh" denotes a hexadecimal notation, and "FFh" denotes "11111111" in a binary notation. Thus, all the output value of latches for the 8 bits are set to "1".

In addition, in the semiconductor integrated circuit 1, a write command for performing writing into a non-volatile memory, for example, a write command ["AAh"—"55h"—"A0h" —PD] is input to the command system circuit 8, whereby a write flag signal from the command system circuit 8 is output to the data fetch control portion 7. On the other hand, a 4-cycle write enable signal WE# is input to the data fetch control portion 7. Then, the data fetch control portion 7 outputs to the data latch portion 4 a latch flag STDATA (PA, PD latch flag) that is a data fetch pulse in synchronism with the write enable signal WE#. The data fetch pulse is a one-shot pulse having a protrusive pulse shape.

Hereinafter, description will be given in more detail. FIG. 3 is a partially enlarged view of the timing chart of the semiconductor integrated circuit 1 shown in FIG. 2. As shown in FIG. 3, a write command and a write address PA are input to the semiconductor integrated circuit 1 in synchronism with the write enable signal WE#, whereby the write data PD (program data) and write address PA corresponding to the protrusive pulse of the latch flag STDATA of the write data PD and write address PA are input to the data latch portion 4. After holding these data, the data latch portion 4 automatically generates a write pulse internally, thereby automatically performing a write operation for memory cells 6 of a non-volatile memory.

For example, in the case where a write command is ["AAh"—"55h"—"A0h"—PD], and a write address PA is ["555h"—"2AAh"—"555h"—PA], the write command ["AAh"—"55"—"A0h"—PD] and the write address ["555h"—"2AAh"—"555h"—PA] are input to the semiconductor integrated circuit 1 in synchronism with the write enable signal WE#, thereby holding the write data PA and write data PD corresponding to the protrusive pulse of the latch flag STDATA. Then, a write pulse is automatically generated internally, thereby automatically performing a write operation for the non-volatile memory. At this time, the write enable signal WE# is about 1 microsecond ($\mu$s) at one cycle. Thus a time of 4 microsecondsis required to cause the write data PD and write address PA to be input to the data latch portion 4. Further, a time of 8 microseconds is required to cause these data to be transferred from the data latch portion 4 to the memory cells 6 of the non-volatile memory.

FIG. 4 is a flow chart showing a write operation of a conventional semiconductor integrated circuit 1. As shown in FIG. 4, in the semiconductor integrated circuit 1, a write command is input to a command system circuit 8 (step S41); whereby the write data PD and the write address PA are latched in the data latch portion 4 (step S42); write verify processing (write check processing) is performed for the memory cell 6 selected by the latched write address PA; the write data PD is compared with the memory cell data read out from the memory cell 6 (step S43); and if writing fails (if NG at the step S43), writing (step S44) is performed, and then, the write verify processing (write check processing) (step S43) is performed again. Such write processing and write verify processing (write check processing) are continuously performed until write check processing has been omitted ("Verify Pass"). On the other hand, if writing is successful (if OK at the step S43), write operation is terminated (step S45).

FIG. 5 is a block diagram showing a write operation in the "x 8 mode" for the lower order side input and/or output pins I/O 0 to I/O 7 (not shown) of the non-volatile memory. In the conventional semiconductor integrated circuit 1 having a non-volatile memory, as shown in FIG. 5, in the case where writing operation into the lower order side input and/or output pins I/O 0 to I/O 7 (not shown) of the non-volatile memory is performed after the "x 8 mode" has been selected, the write data PD is divided into first write data PD1 and second write data PD2. The first write data PD1 is first input to an input buffer 2 via the external data pins DQ0 to DQ7.

At this time, in the case where the logical value of the least significant address [A-1] of the write address PA input to the switch portion 3 is "L", the input first write data PD1 is distributed by means of the switch portion 3 in the latches L0 to L7 that configure the lower order side of the data latch portion 4. The fetched data is then latched by the latches L0 to L7.

At this time, as described above, latches L8 to L15 that configure the upper side of the data latch portion 4 are forcibly set to write data "1" by means of the upper side reset signal RST1. The write data "1" indicates a state in which data has already been written, and thus, the latches L8 to L15 are not targeted to be written data in write operation, that is, the latches L8 to L15 are "No Care". Therefore, the latches L8 to L15 can pass the write verify processing. As a result, their output value is "FFh".

Then, the write data PD is written into the lower order side input and/or output pins I/O 0 to I/O 7 of the non-volatile memory via a write circuit 5. Further, the values of the upper order side input and/or output pin I/O 8 to I/O 15 (not shown) are set to "FFh", and thus, write check processing is omitted ("Verify pass").

Then, the second write data PD2 is written into the input and/or output pins I/O8 to I/O15 at the upper side of the non-volatile memory. FIG. 6 is a block diagram showing a write operation in the "x 8 mode" for the upper order side input and/or output pins I/O 8 to I/O 15 in the conventional semiconductor circuit 1. As shown in FIG. 6, unlike the write operation in the "x 8 mode" for the lower order side input and/or output pins I/O shown in FIG. 5, in the case where writing into the upper order side input and/or output pins I/O 8 to I/O 15 of the non-volatile memory is performed after the "x 8 mode" has been selected, the second write data PD2 is input to the input buffer 2 via the external data pins DQ0 to DQ7.

At this time, the logical value of the least significant address [A-1] of the write address PA is "H". Thus, the second write data PD2 is distributed by switch portion 3 into the latches L8 to L15 that configure the upper order side of the data latch portion 4, and is latched in the latches L8 to L15. At this time, the output values of the latches L0 to L7 that configure the lower order side of the data latch portion 4 are forcibly set to "FFh" by means of the lower order side reset signal RST2.

Then, the second write data PD2 is written into the upper order side input and/or output pins I/O 8 to I/O 15 of the non-volatile memory via the write circuit 5. For the lower order side input and/or output pins I/O 0 to I/O 7 of the non-volatile memory, their values are set to "FFh", and thus, write check processing is omitted ("Verify Pass").

However, in the aforementioned conventional semiconductor integrated circuit, there are the problems described below. As shown in FIG. 2, in the conventional semiconductor integrated circuit 1, in the case where the "x 8 mode" is selected as a write operation, only 8-bits write data can be fetched at one write cycle of a write command. Therefore, in the case where 16-bits write data PD is fetched in the "x 8 mode", it is required to execute two command write cycles. Thus, there is a problem that a write operation speed in the semiconductor integrated circuit 1 is lowered.

That is, it is required to set the logical value of the least significant address [A-1] of the write address PA to "L"; and write the first write data PD1 into the lower order side input and/or output pins I/O 0 to I/O 7 at a first write cycle of a write command; and then, set the logical value of the least significant address [A-1] of the write address PA to "H", and write the second write data PD2 into the upper order side input and/or output pins I/O 8 to I/O 15 at a second write cycle of a write command. At this time, as shown in FIGS. 2 and 3, one write cycle of a write command requires a time of about 12 microseconds, and thus, two write cycle of a write command require a time of about 24 microseconds.

In addition, in the conventional semiconductor integrated circuit having a non-volatile memory, there exists a mode capable of reducing a write command called a continuous mode. However, in the continuous mode as well, only a write command can be simplified. In the case where an operation for writing 16-bits data in the "x 8 mode" is performed in the continuous mode, there is a problem that two write operations are required.

Further, Japanese Patent Application Laid-open No. 2-140853 discloses a bus width converting circuit for connecting a CPU for inputting and/or outputting data in a 16-bits bus width to a peripheral device for inputting and/or outputting data in a 8-bits bus width. In this bus width converting circuit, a counter circuit is provided for the purpose of speeding up a data transfer speed between the CPU and the peripheral device. 16-bits data input from the CPU is divided into 8 bits to be outputted to the peripheral device in accordance with an instruction from this counter circuit. In addition, 8-bits data input from the peripheral device is integrated into 16 bits to be outputted to the CPU.

However, in this bus width converting circuit, there is a problem that a circuit configuration becomes complicated because a counter circuit is required. In addition, a counting system of this counter circuit is based on a counter system of "00" (0 byte hold)—"01" (1 byte hold)—"10" (CPU transfer). Thus, there may be a case in which, when "01" (1 bytehold) is counted up to "10" (CPU transfer), a wiring delay occurs, and a state of "01" (1 byte hold)—"00" (0 byte hold)—"10" (CPU transfer) occurs. Thus, there may occur a malfunction that 0 byte is mistakenly fetched when the count value is "00" (0 byte hold).

SUMMARY OF THE INVENTION

It is an object of the present invention to provide a semiconductor integrated circuit capable of reducing the number of write cycle of a write command to one when [m×n] bits data is written in a write mode "x m mode", and capable of operating with high reliability.

A semiconductor integrated circuit comprises: a non-volatile memory; a data latch portion having [m×n] latches, holding input write data in [m×n] bits length, and outputting the write data to the non-volatile memory in batch; and a data fetch control portion for generating a data fetch pulse for fetching the write data into each latch of the n separate parts based on the logical value of the least significant address of write addresses in one write cycle of a write command of writing the write data into the non-volatile memory in "x m mode",wherein the data fetch control portion repeats a write data fetch command n times when the write command is input in the write cycle of the write command, and inputs the write data of [m×n] bits in length to the data latch portion for each m bits in "x m mode", and the data latch portion outputs the write data of [m×n] bits in length to the non-volatile memory in batch.

In the present invention, in the case where [m×n] bits data is written in m-bits unit write mode, a number of write cycle of a write command can be reduced to one. As a result, the write time can be reduced.

In addition, the semiconductor integrated circuit comprises: an input buffer having external data pins; and a switch portion connected to the input buffer, wherein the write data is input from the external data pins, and the write data is distributed into each latch of the n separate parts of the data latch portion through switch control performed by the switch portion via the input buffer.

In the semiconductor integrated circuit of the present invention, there is eliminated a reset circuit for resetting the output signal of each latch at the data latch portion that has been necessary, and a circuit configuration can be simplified.

Furthermore, the semiconductor integrated circuit comprises a write circuit, wherein the fetched write data of [m×n] bits in length input to the data latch portion is written into the non-volatile memory in batch in [m×n] bits via the write circuit. Still furthermore, m may be 8 and n may be 2, and the data fetch pulse may be formed in a one-shot pulse shape.

BRIEF DESCRIPTION OF THE DRAWINGS

FIG. 8 is a timing chart showing a write operation for the semiconductor integrated circuit according to the embodiment.

DETAILED DESCRIPTION OF THE PREFERRED EMBODIMENT

Figure 7:
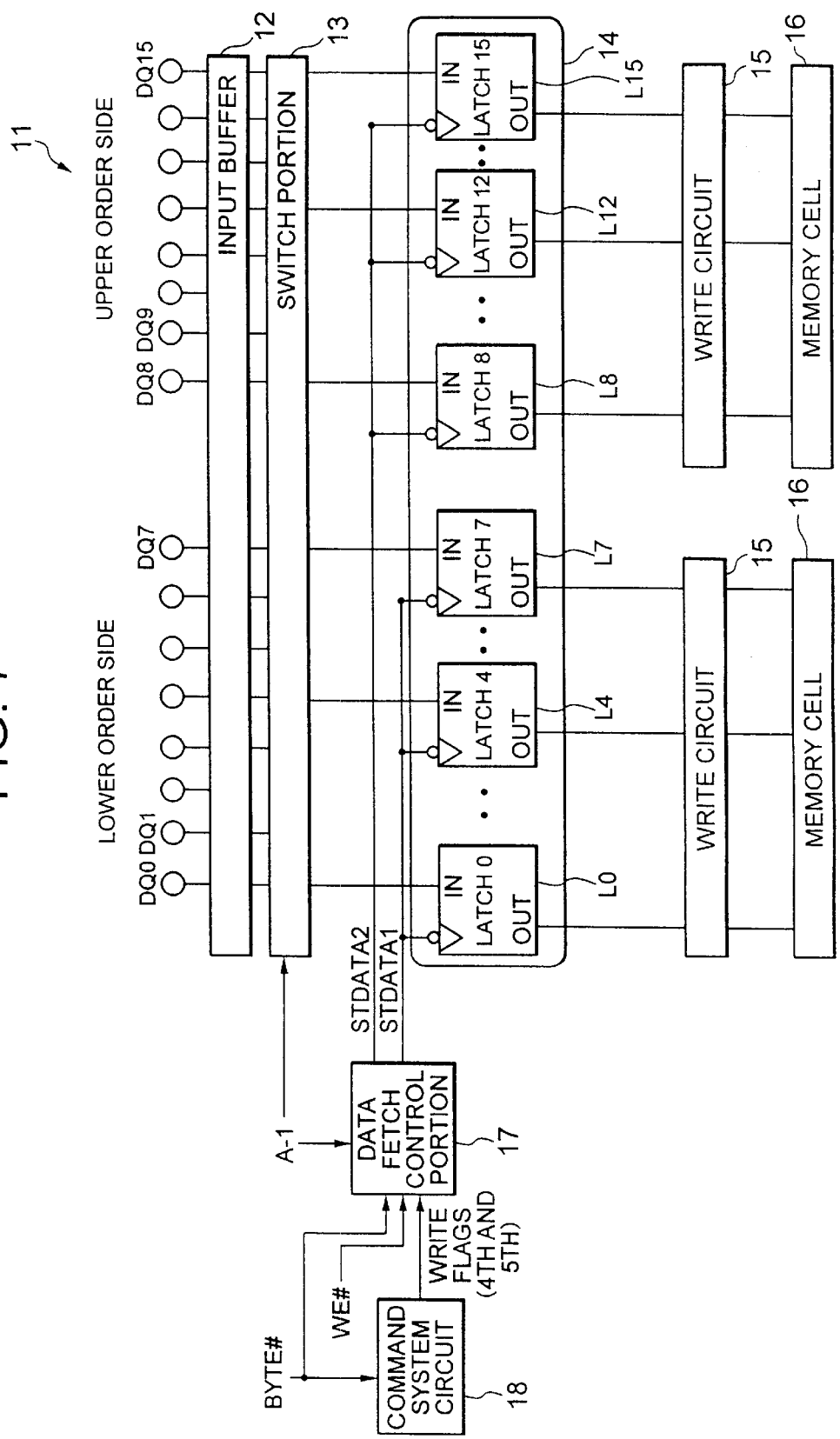
FIG. 7 is a block diagram showing a configuration of a semiconductor integrated circuit having a non-volatile memory according to an embodiment of the present invention.

Hereinafter, An embodiment of the present invention will be specifically described with reference to the accompanying drawings. FIG. 7 is a block diagram showing a configuration of a semiconductor integrated circuit 11 having a non-volatile memory according to the embodiment of the present invention. As shown in FIG. 7, the semiconductor integrated circuit 11 comprises an input buffer 12 for controlling data input and/or output having sixteen external data pins DQ1 to DQ15, and a switch portion 13 is connected to the input buffer 12. An external address pin (not shown) is connected to the switch portion 13 so that the least significant address [A-1] of a write address PA (program address) is input. In addition, a data latch portion 14 for saving input data for a short time is provided so as to be connected to the switch portion 13; write circuits 15 is provided so as to be connected to the data latch portion 14; and a non-volatile memory having a plurality of memory cells 16 is provided so as to be connected to the write circuit 15. In addition, 16 latches L0 to L15 are provided at the data latch portion 14. Each latch holds 1-bit data until a new signal has been input.

To the input buffer 12, data is externally input via external data pins DQ1 to DQ15. Data is input from the input buffer 12 to the switch portion 13. The data is distributed into the latches L0 to L7 that configure the lower order side of the data latch portion 14 or latches L8 to L15 that configure the upper order side of the data latch portion 14 based on the least significant address [A-1] of the write address PA input from the external address pin. The data latch portion 14 provides a circuit configuration such that the fetched write data PD of 16 bits in length is written into memory cells 16 of the non-volatile memory in batch via the write circuit 15.

In addition, a data fetch control portion 17 is provided so as to be connected to the data latch portion 14, and a command system circuit 18 is provided so as to be connected to the data fetch control portion 17. A write enable signal WE# for controlling a write operation of the semiconductor integrated circuit 11 and a write mode switching signal BYTE# for switching the write mode are input to the data fetch control portion 17. Further, the write mode switching signal BYTE# is input to the command system circuit 18.

The data fetch control portion 17 activates a lower order side latch flag STDATA1 and an upper order side latch flag STDATA2 that are data fetch pulses, and outputs the flags to the data latch portion 14, based on a logical value of the least significant address [A-1] of a write address PA input from an external address pin. The lower order side latch flag STDATA1 is a latch flag of the lower order side of the write data PD and write address PA, and is a one-shot pulse that has its wave formed in a protrusive pulse shape. The upper order side latch flag STDATA2 is a latch flag of the upper order side of the write data PD and write address PA, and is a one-shot pulse having its protrusive pulse shape.

The semiconductor integrated circuit 11 having the non-volatile memory enables operation in two modes, i.e., "x 8 mode" for writing data in units of 8 bits and "x 16 mode" for writing data in units of 16 bits, and performs switching by the write mode switching signal BYTE#. For example, when the logical value of the write mode switching signal BYTE# is "L", the "x 8 mode" is selected. Alternatively, when the logical value of the write mode switching signal BYTE# is "H", the "x 16 mode" is selected.

Hereinafter, an operation of the semiconductor integrated circuit 11 according to the present embodiment will be described. FIG. 8 is a timing chart showing a write operation for the semiconductor integrated circuit 11. As shown in FIGS. 7 and 8, the logical value of the write mode switching signal BYTE# is "L"; this signal is input to the data fetch control portion 17 and the command system circuit 18; and the "x 8 mode" is selected as a write mode.

Next, a write command is input to the command system circuit 18 in synchronism with the write enable signal WE# input to the data fetch control portion 17. Then, a write flag signal is outputted from the command system circuit 18 to the data fetch control portion 17. For example, the write command is ["AAh"—"55h"—"A0h"—"first write data PD1"—"second write data PD2"], whereby a write flag signal output from the command system circuit 18 to the data fetch control portion 17 is activated when the first write data PD1 and the second write data PD2 are input.

On the other hand, when the least significant address [A-1] of the write address PA is input to the switch portion 13 and the data fetch control portion 17 via the external address pin, the logical value of the least significant address [A-1] is "L".

Next, the data fetch control portion 17 outputs the lower order side latch flag STDATA1 that is a data fetch pulse to the data latch portion 14 based on the logical value "L" of the least significant address [A-1] of the write address PA input via the external address pin.

On the other hand, write data PD of 16 bits in length is externally input to the input buffer 12 via the external data pins DQ0 to DQ7. The write data PD is divided into first write data PD1 of 8 bits in length and second write data PD2 of 8 bits in length to be input separately twice. First, the first write data PD1 is input to the input buffer 12.

Then, the switch portion 13 performs switch control via the input buffer 12 based on the logical value "L" of the least significant address [A-1] of the write address PA. Further, the first write data PD1 having a 8-bits data structure is distributed into latches L0 to L7.

Next, the first write data PD1 distributed by the switch portion 13 is fetched in the latches L0 to L7 that configure the lower order side of the data latch portion 14 when the data is synchronized with the lower order side latch flag STDATA1 that functions as a data fetch pulse, i.e., when the signal waveform of the lower order side latch flag STDATA1 becomes a one-shot pulse of a protrusive pulse.

Next, the logical value of the least significant address [A-1] of the write address PA input to the switch portion 13 and the data fetch control portion 17 is switched from "L" to "H".

Then, the data fetch control portion 17 outputs the upper order side latch flag STDATA2 that is a data fetch pulse to the data latch portion 14 based on the logical value "H" of the least address [A-1] of this write address PA.

On the other hand, the second write data PD2 is input to the input buffer 12 via the external data pins DQ0 to DQ7.

Then, the switch portion 13 performs switch control via the input buffer 12 based on the logical value "H" of the least significant address [A-1] of the write address PA, and distributes the write data PD2 into the latches L8 to L15.

Next, the write data PD2 distributed by the switch portion 13 is fetched in the latches L8 to L15 that configure the upper order side of the data latch portion 14 when the data is synchronized with the upper order side latch flag STDATA2 that functions as a data fetch pulse, i.e., when the signal waveform of the upper order side latch flag STDATA2 becomes a one-shot pulse of a protrusive pulse.

Then, the write data PD of 16 bits in length fetched in the data latch portion 14 is written into memory cells 16 of the non-volatile memory in batch via the write circuit 15.

As has been described above, according to the present embodiment, in the case where 16-bits data is written in a write mode "x 8 mode", the number of the write cycle of a write command can be reduced to one. As a result, there is provided an advantageous effect that a write time can be reduced.

Figure 2:
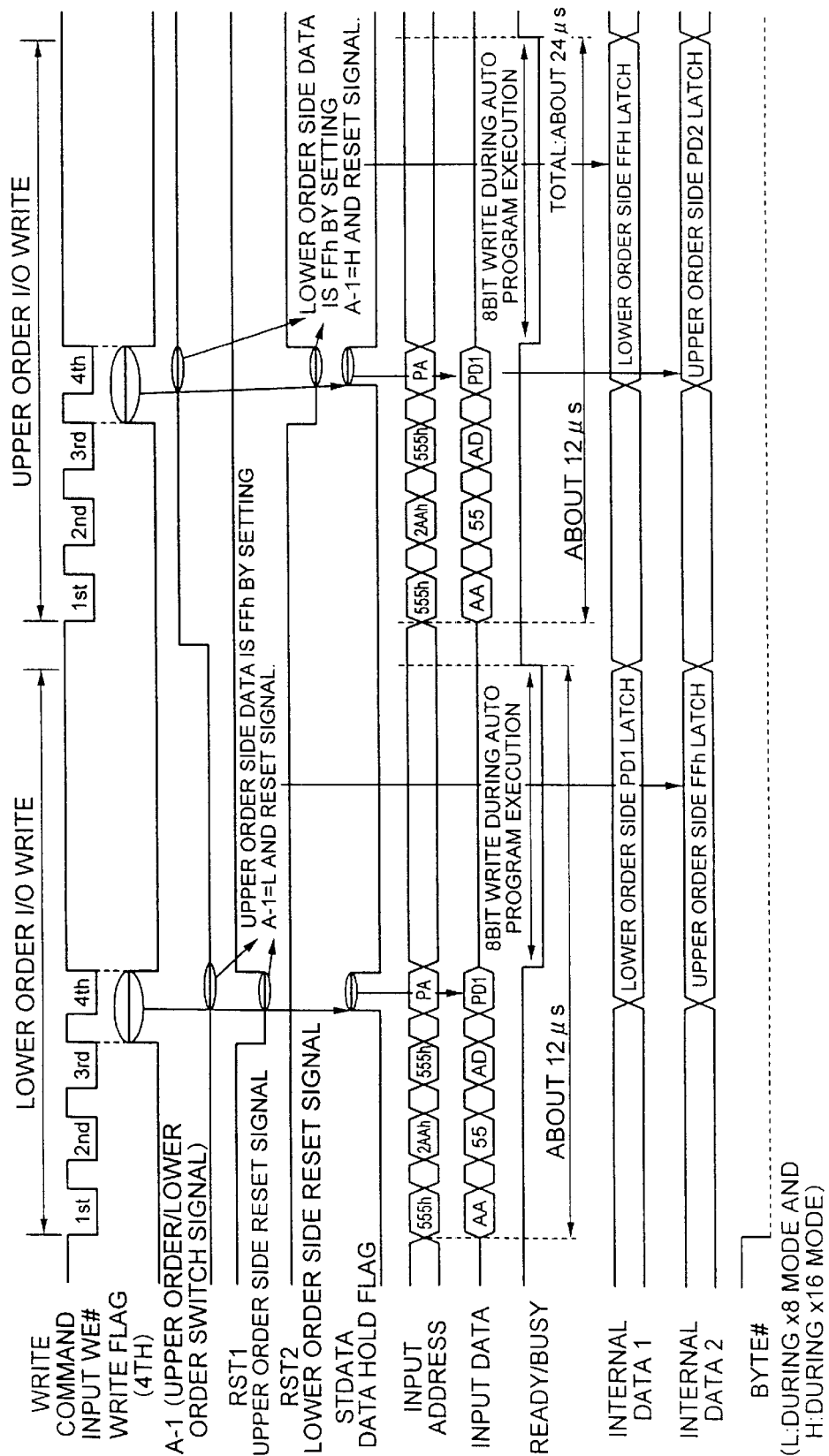
FIG. 2 is a timing chart showing a write operation for writing 16-bits data in the "x 8 mode" in the conventional semiconductor integrated circuit.
Figure 3:
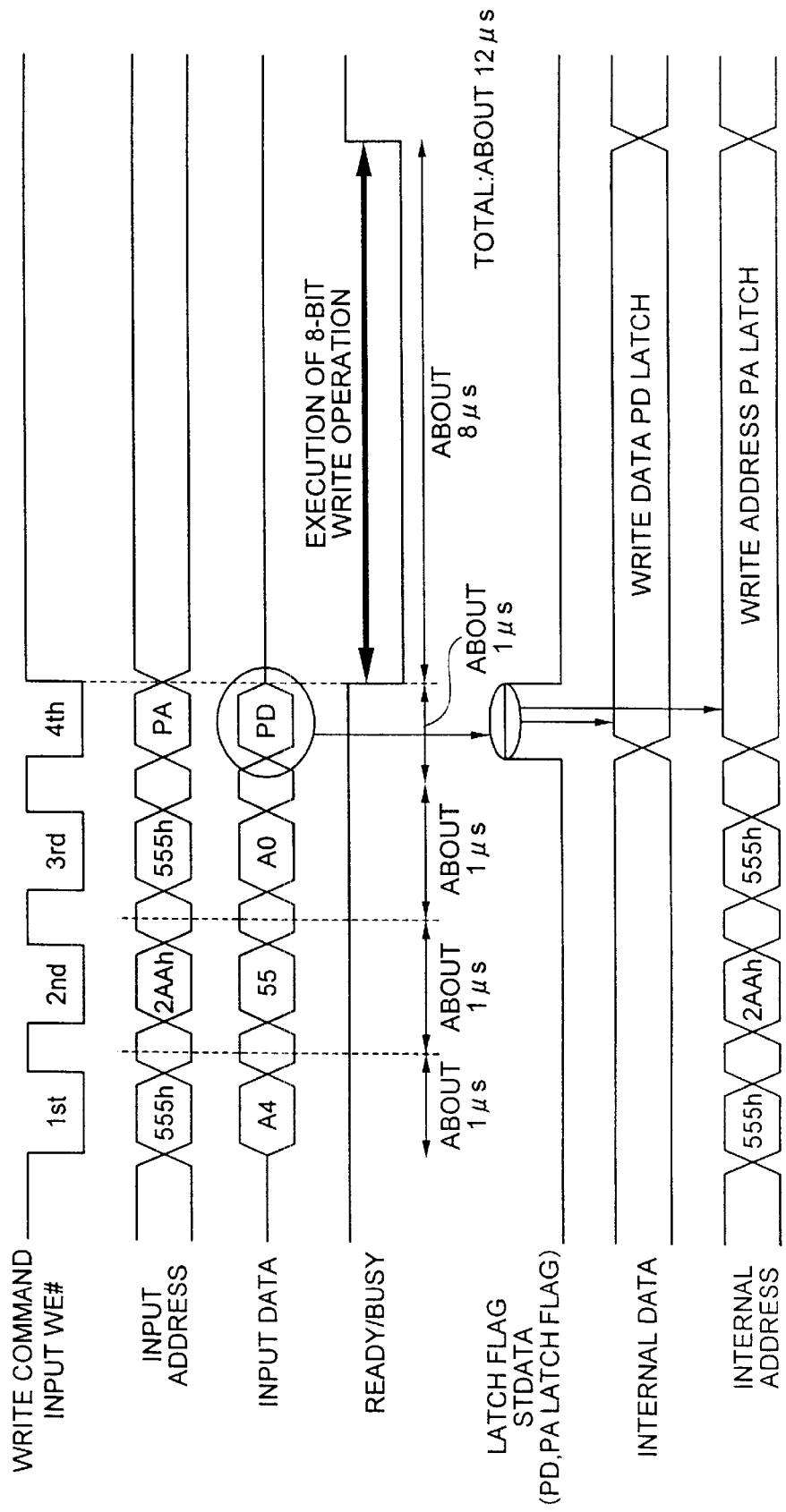
FIG. 3 is a partially enlarged view of the timing chart of the semiconductor integrated circuit shown in FIG. 2.
Figure 4:
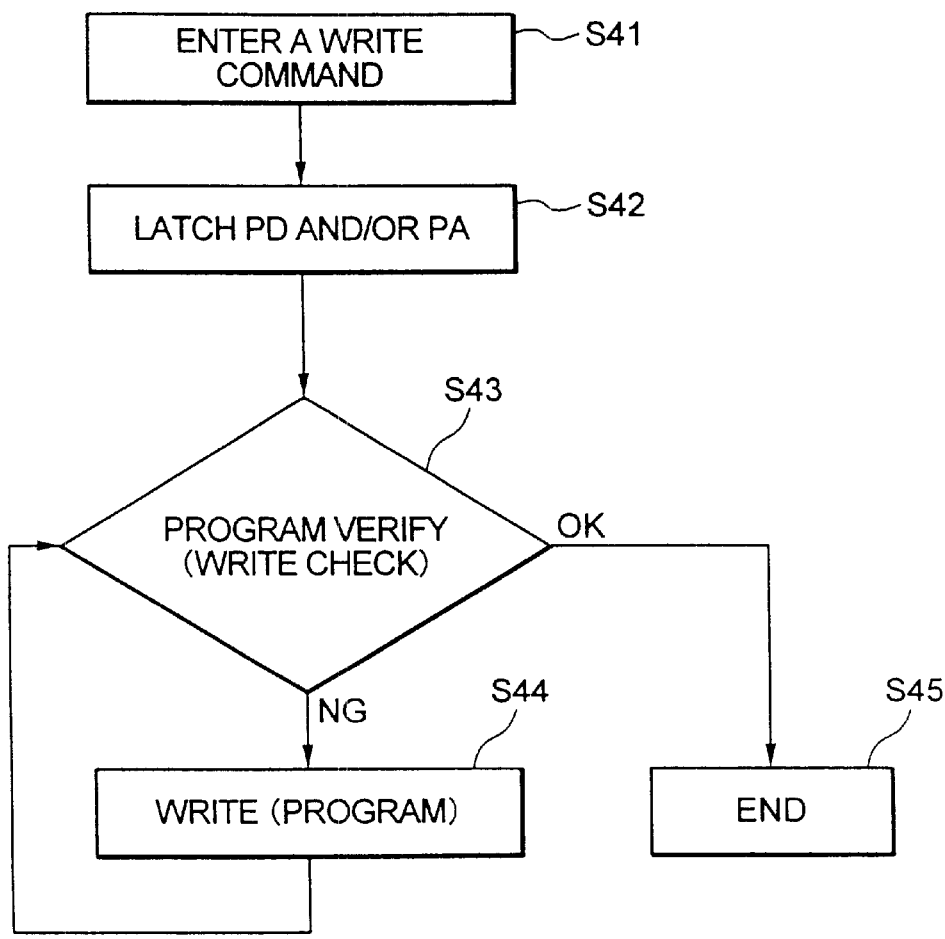
FIG. 4 is a flow chart showing a write operation of the conventional semiconductor integrated circuit.
Figure 5:
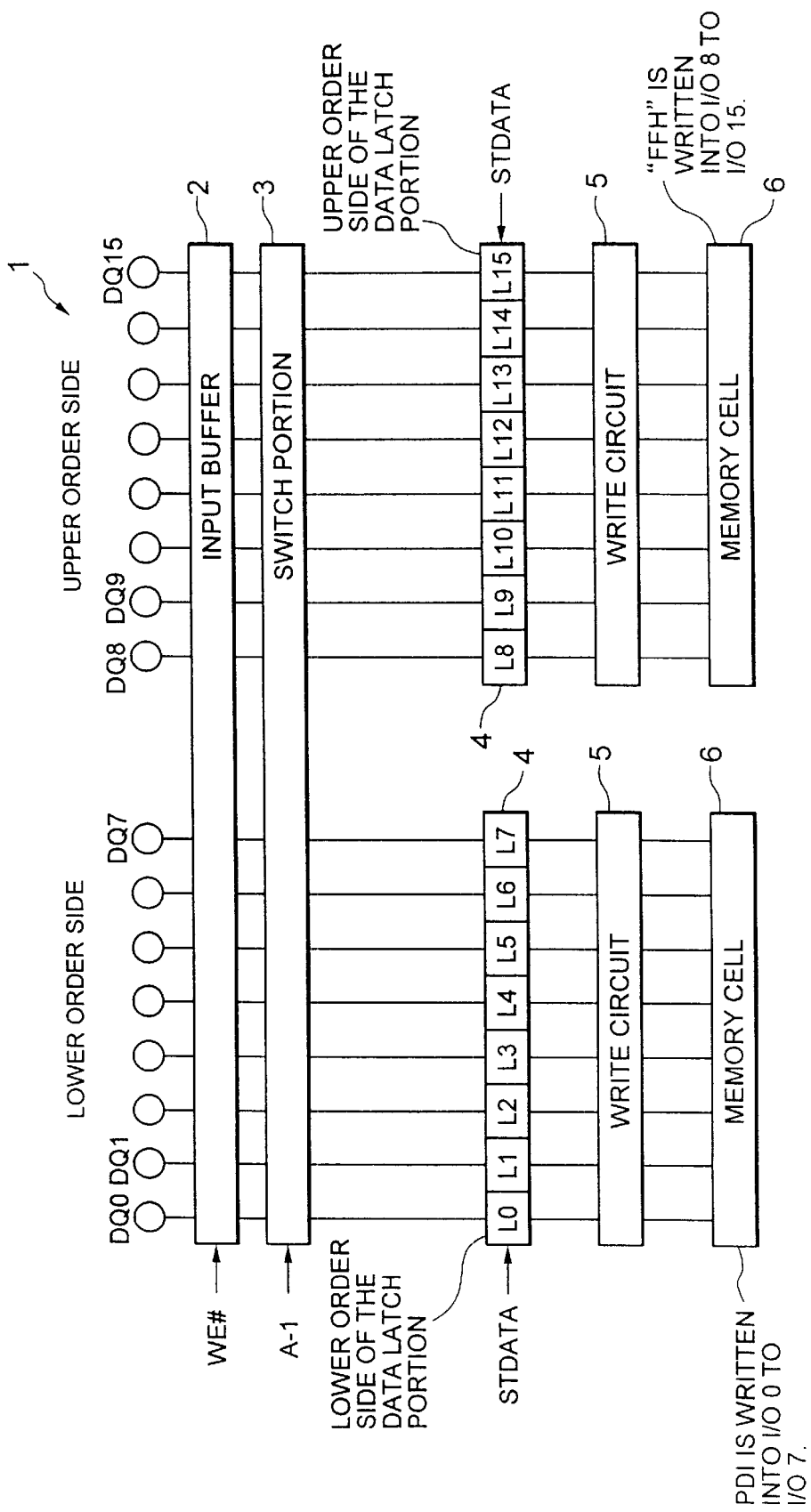
FIG. 5 is a block diagram showing a write operation in a "x 8 mode" for lower order side input and/or output pins I/O 0 to I/O 7 in the conventional semiconductor integrated circuit.
Figure 6:
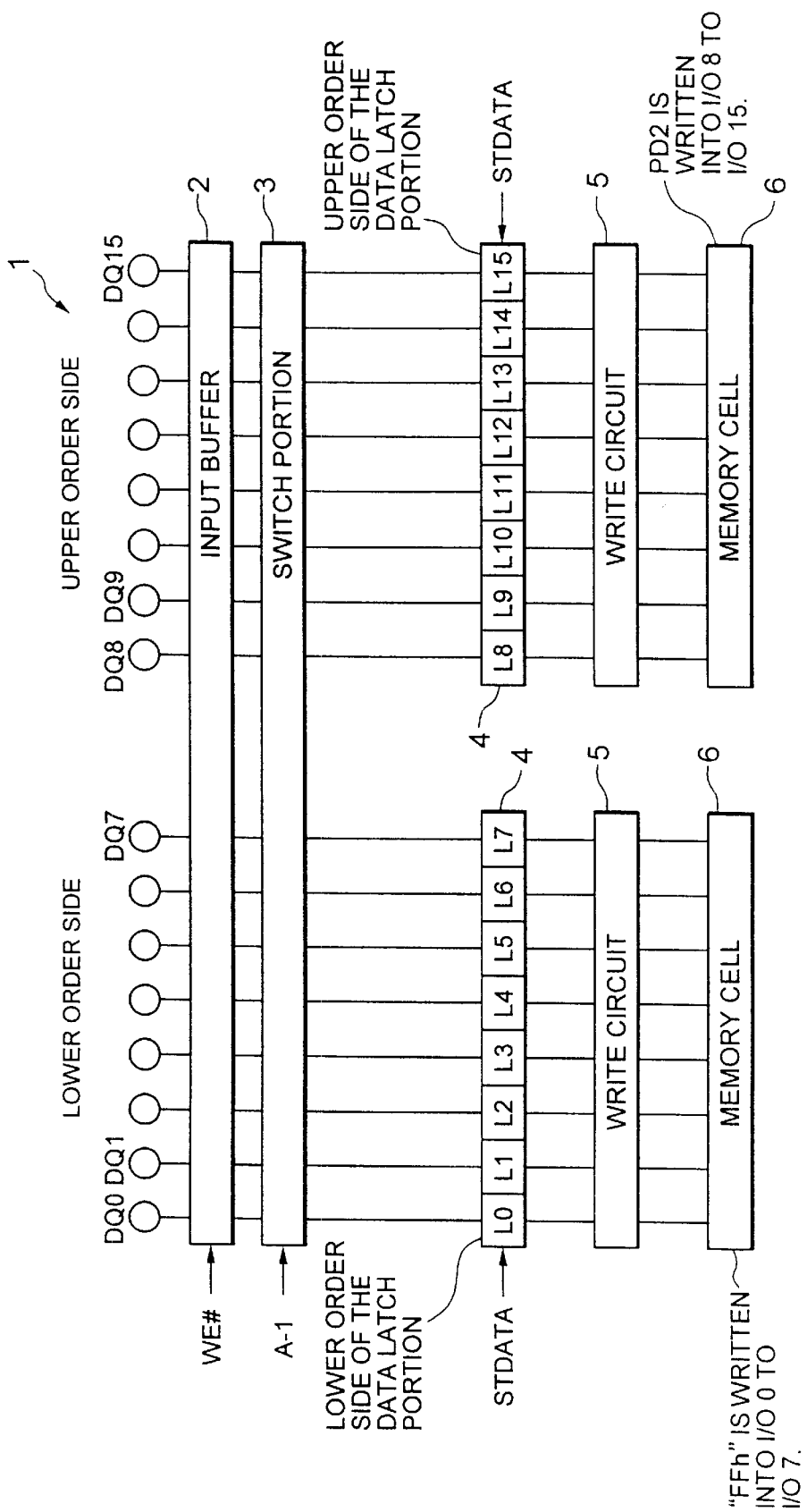
FIG. 6 is a block diagram showing a write operation in a "x 8 mode" for lower order side input and/or output pins I/O 8 to I/O 15 in the conventional semiconductor integrated circuit.

As described above, in the conventional semiconductor integrated circuit 1 having the non-volatile memory, in the case where 16-bits data is written in a write mode "x 8 mode", two write cycles of a write command have been necessary. For example, as shown in FIG. 2, 1 microsecond is required for one command entry. Thus, four command entries are required, and a time of 4 microseconds(=1 microsecond×4 times) is required. Further, a write time requires 8 microseconds, and thus, one write cycle is 12 microseconds (=4 microseconds+8 microseconds). This cycle is repeated twice, and thus, a total time of 24 microseconds (=12 microseconds×2 times) is required. In contrast, in the present embodiment, as shown in FIG. 8, a time of 5 micro seconds is required for 5 command entries. Further, a write time merely requires 8 microseconds, and writing can be terminated within a total time of 13 microseconds (5 microseconds+8 microseconds).

A sector is a deletion unit. Writing/deletion is often performed for each sector. Assuming that the sector capacity is 512 Kbits, the write time can be reduced from 0.768 seconds to 0.416 seconds.

On the other hand, in the conventional semiconductor integrated circuit 1, there exists a mode called a continuous mode, in which a write command can be reduced. For example, a write operation for reducing a write command to two commands is possible such that a write command {"A0h"—write data PD} is performed after the continuous mode has been entered by the write command {"AAh"—"55h"—"20h"}. A 16-bits write in the write mode "x 8 mode" in which the write command is reduced to two commands requires 20 microseconds, and a time of 0.64 seconds is required for one sector. In this manner, the semiconductor integrated circuit 11 of the present embodiment can reduce a write time in comparison with the continuous mode of the conventional semiconductor integrated circuit 1.

Figure 1:
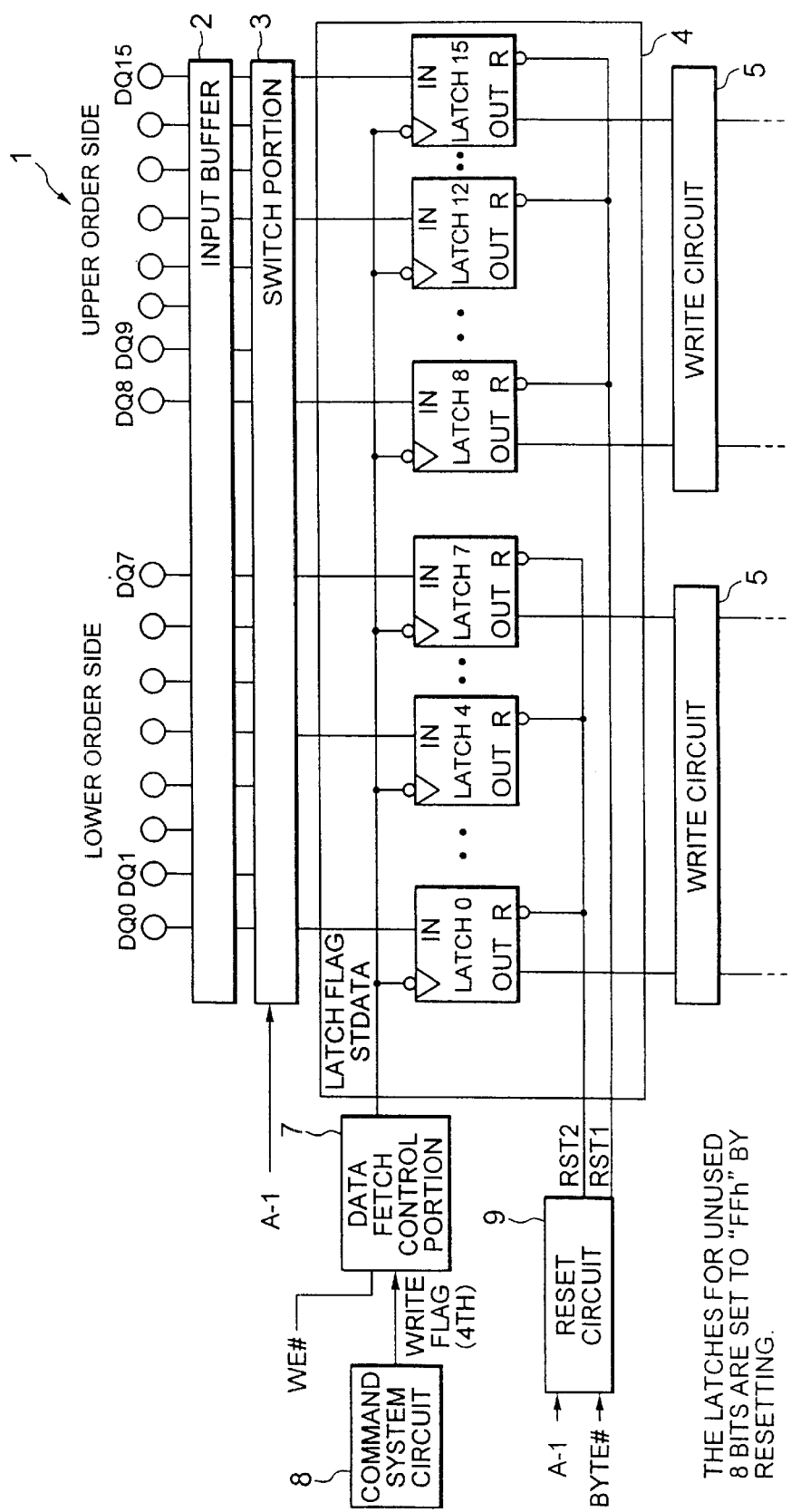
FIG. 1 is a block diagram showing a configuration of a conventional semiconductor circuit.

In addition, the semiconductor integrated circuit 11 can write 16-bits data in batch in the write mode "x 8 mode" as well. Thus, there can be eliminated a reset circuit for an unused 8-bits latch that exists in the conventional semiconductor integrated circuit 1 (refer to FIG. 1) having the non-volatile memory, a latch configuration without requiring a reset function can be achieved. In this manner, the configuration of the semiconductor integrated circuit can be simplified.

Further, 16-bits data is written in batch in the write mode "x 8 mode" as well. Thus, there is eliminated an unused 8-bits latch reset circuit that exists in the conventional semiconductor integrated circuit having the non-volatile memory and a reset signal oscillated from this reset circuit, and a region for forming the write circuit 15 can be reduced.

As shown in FIG. 8, in the present embodiment, in the case where the logical value of the least significant address [A-1] of the write address PA is "L" after the first write data PD1 has been specified by the first write data fetch command (4th command), the lower order side write data (PD1) is fetched. Then, in the case where the logical value of the least significant address [A-1] of the write address PA is "H" after the second write data PD2 has been specified by the second write data fetch command (5th command), the upper order side write data (PD2) is fetched.

In the present embodiment, in the first and second write data fetch commands (4th command and 5th command), the first write data PD1 is correlated with the logical value "L" of the least significant address [A-1] of the write address PA; and the second write data PD2 is correlated with the logical value "H" of the least significant address [A-1]. By reversing this correlation, it is possible to fetch the upper order side data by the first write data fetch command (4th command) and to fetch the lower order side data by the second write data fetch command (5th command).

In the present embodiment, when the first write data PD1 is input, the logical value of the least significant address [A-1] of the write address PA is "L". Then, the first write data PD1 is latched in latches L0 to L7 that configure the lower order side of the data latch portion 14. Similarly, when the second write data PD2 is input, the logical value of the least significant address [A-1] of the write address PA is "H". Then, the second data PD2 is latched in the latches L8 to L15 that configure the upper order side of the data latch portion 14.

In the present embodiment, after write data PD has been specified by the first write data fetch command (4th command), the second write data fetch command (5th command) is fixed to "FFh" so that omission of the write check processing (Verify Pass) can be performed, thereby making it possible to cope with a write operation in accordance with a conventional command system. As a result, the degree of freedom relevant to a write operation can be extended. In addition, a switch portion 14 is divided into four sections by two external address pins, and a data fetch pulse is divided into four pulses, thereby enabling a segmented write operation such that write data PD of 16 bits in length is input to be divided into four commands by 4 bits.

In the present embodiment, it is possible to reverse an operation of the least significant address [A-1] of the write address PA. That is, when the first write data PD1 is input, the logical value of the least significant address [A-1] of the write address PA is "H". Then, the first write data PD1 is latched in the latches L8 to L15 that configure the upper order side of the data latch portion 14. In addition, when the second write data PD2 is input, the logical value of the least significant address [A-1] in the write address PA is "L". Then, there is provided a circuit configuration in which the second write data PD2 can be latched in the latches L0 to L7 that configure the lower order side of the data latch portion 14, thereby making it possible to reverse the sequence of fetching write data PD.

According to the semiconductor integrated circuit of the present embodiment, there is provided a circuit configuration in which the first write data PD1 and the second write data PD2 are controlled to be fetched and to be transferred (written) to the upper order side and lower order side of the data latch portion 14, based on the logical value of the least significant address [A-1] of the write address PA. Thus, a counter circuit as described in Japanese Patent Application Laid-open No. 2-140853 is eliminated.

In addition, in the semiconductor integrated circuit of the present embodiment, even in the case where a sequence of "00" (0 byte hold)—"01" (1 bytehold)—"110" (CPU transfer) is fixed, data switching is performed through external control in which the logical value of the least significant address [A-1] of the write address PA in the external address pin is referred to without using a counter control. Thus, there can be easily achieved a circuit configuration such that latching of the write data PD1 and PD2 can be arbitrarily set to the upper order side and lower order side of the data latch portion 14. As a result, there is achieved an advantageous effect that the degree of freedom relevant to a memory user can be extended.

Further, according to the present embodiment, there is provided a circuit configuration in which data is held under the aforementioned external control using a protrusive pulse (one-shot pulse). Thus, there does not occur a malfunction that was seen in the art described in Japanese Patent Application Laid-open No. 2-140853.

The present invention is not limited to the foregoing embodiment, and it is apparent that various modifications can occur with the embodiment within the scope of technical idea of the present invention. In addition, the number, position, and shape of the constituent elements are not limited to the foregoing embodiment, and a preferred number, position, and shape of the elements can be determined in carrying out the present invention.

What is claimed is:

1. A semiconductor integrated circuit comprising:
    a non-volatile memory;
    a data latch portion having [m×n] latches, holding input write data in [m×n] bits length, and outputting the write data to the non-volatile memory in batch; and
    a data fetch control portion for generating a data fetch pulse for fetching the write data into each latch of the n separate parts based on a logical value of the least significant address of write addresses in one write cycle of a write command of writing the write data into the non-volatile memory in "x m mode", wherein the data fetch control portion repeats a write data fetch command n times when the write command is input in the write cycle of the write command, and inputs the write data of [m×n] bits in length to the data latch portion for each m bits in "x m mode", and the data latch portion outputs the write data of [m×n] bits in length to the non-volatile memory in batch.

2. A semiconductor integrated circuit according to claim 1, comprising:
    an input buffer having external data pins; and
    a switch portion connected to the input buffer, wherein the write data is input from the external data pins, and the write data is distributed into each latch of the n separate parts of the data latch portion through switch control performed by the switch portion via the input buffer.

3. A semiconductor integrated circuit according to claim 1, comprising a write circuit, wherein the fetched write data of [m×n] bits in length input to the data latch portion is written into the non-volatile memory in batch in [m×n] bits via the write circuit.

4. A semiconductor integrated circuit according to claim 1, m is 8 and n is 2.

5. A semiconductor integrated circuit according to claim 4, comprising:
    a command system circuit; and
    an external address pin connected to the data fetch control portion and the switch portion, wherein the write command is input to the command system circuit, the command system circuit outputs a write flag signal to the data fetch control portion, the data fetch control portion outputs to the data latch portion a lower order side latch flag and an upper order side latch flag that are the data fetch pulses based on the logical value of the least significant address of the write address input from the external address pin, the write data is fetched from the each external data pin at the lower order side of the input buffer, the switch portion performs switch control via the input buffer based on the logical value of the least significant address of the write address, thereby distributing the write data into each latch that configure the lower order side and upper order side of the data latch portion, and the data latch portion fetches the distributed write data in synchronism with the lower order side latch flag and the upper order side latch flag that function as the data fetch pulse, and writes the data into the non-volatile memory in batch.

6. A semiconductor integrated circuit according to claim 1, wherein the data fetch pulse is formed in a one-shot pulse shape.

* * * * *